United States Patent [19]

Hart et al.

[11] Patent Number: 4,858,141

[45] Date of Patent: Aug. 15, 1989

[54] NON-INTRUSIVE APPLIANCE MONITOR APPARATUS

[75] Inventors: George W. Hart, Natick; Edward C. Kern, Jr., Lincoln; Fred C. Schweppe, Carlisle, all of Mass.

[73] Assignees: Massachusetts Institute of Technology, Cambridge, Mass.; Electric Power Research Institute, Inc., Palo Alto, Calif.

[21] Appl. No.: 851,235

[22] Filed: Apr. 14, 1986

[51] Int. Cl.$^4$ .................. G01R 21/06; G06F 15/46
[52] U.S. Cl. .................. 364/483; 364/464.04; 364/550; 364/492; 340/657; 340/664
[58] Field of Search .................. 364/481–483, 364/492, 493, 550, 551, 464; 324/76 R, 107, 103 R; 340/635, 657, 660, 664

[56] References Cited

U.S. PATENT DOCUMENTS

| | | | |
|---|---|---|---|
| 4,207,557 | 6/1980 | Gilkeson et al. | 364/464 |
| 4,360,881 | 11/1982 | Martinson | 364/483 |
| 4,442,492 | 4/1984 | Karlsson et al. | 364/464 |
| 4,476,535 | 10/1984 | Loshing et al. | 364/550 |
| 4,539,562 | 9/1985 | Sanders | 340/657 |
| 4,568,934 | 2/1986 | Allgood | 364/464 |
| 4,581,705 | 4/1986 | Gilker et al. | 364/483 |
| 4,612,617 | 9/1986 | Laplace, Jr. et al. | 364/492 |
| 4,612,619 | 9/1986 | Culp | 364/492 |
| 4,628,443 | 12/1986 | Rickard et al. | 364/551 |
| 4,630,211 | 12/1986 | Pettis | 364/464 |
| 4,631,693 | 12/1986 | Neri | 340/664 |
| 4,639,876 | 1/1987 | Deeds | 364/550 |
| 4,672,555 | 6/1987 | Hart et al. | 364/483 |
| 4,694,373 | 9/1987 | Demeyer | 364/483 |
| 4,720,806 | 1/1988 | Schippers et al. | 364/551 |

OTHER PUBLICATIONS

*Proceedings: EPRI Load Research Symposium*, Electric Power Research Institute, Palo Alto, 02/1984.
"Identification of Appliances in Residential Electricity Consumption", David Joshua Brown, M.I.T. 1983.
"Appliance Signatures", Edward C. Kern, Jr., M.I.T., (EPRI), Symposium, Jun. 21–23, 1983, Load Research Symposium, EPRI RP2279-3.
"Non-Intrusive Appliance Load Data Acquisition Method", (Unsolicited Proposal Submitted to the: Electric Power Research Institute, Inc., 12/12/83.
"Non-Intrusive Appliance Load Data Acquisition Method", EPRI RP-2468-2, MIT Energy Lab (Draft Work Plan 6/28/84).
Progress Report "Nonintrusive Appliance Load Data Acquisition Method", George W. Hart, 9/84, MIT Energy Laboratory.

*Primary Examiner*—Felix D. Gruber
*Assistant Examiner*—Brian M. Mattson
*Attorney, Agent, or Firm*—Hamilton, Brook, Smith & Reynolds

[57] ABSTRACT

A non-intrusive monitor of energy consumption of residential appliances is described in which sensors, coupled to the power circuits entering a residence, supply analog voltage and current signals which are converted to digital format and processed to detect changes in certain residential load parameters, i.e., admittance. Cluster analysis techniques are employed to group change measurements into certain categories, and logic is applied to identify individual appliances and the energy consumed by each.

20 Claims, 5 Drawing Sheets

APPLIANCE USAGE

APPLIANCE CONSUMPTION IF LINE VOLTAGE WERE 120V.

LINE VOLTAGE

MEASURED POWER

OUTPUT OF CHANGE DETECTOR

NON-INTRUSIVE APPLIANCE MONITOR APPARATUS

GOVERNMENT SUPPORT

Work discussed herein was sponsored by the Electric Power Research Institute, Contract No. RP-2568-02 and the Department of Energy under Contract Number DE-AC02-76ET20279.

TECHNICAL FIELD

The invention is in the field of electric power usage measurement.

BACKGROUND ART

Electric utilities require information concerning the electric consumption of typical appliances for use in load forecasting and for planning future generation and transmission capacity. Public policy makers also require such information for their guidance in rate setting and reviewing capacity expansion plans.

The energy consumption of any particular appliance can be measured readily in a laboratory, but this does not necessarily indicate the energy consumption of the appliance in typical use. For example, the energy consumption of a refrigerator in a household wherein the door may be frequently opened may be vastly different than under laboratory conditions. Laboratory testing also does not indicate the energy consumption of the existing mix of new and old refrigerators which may be operating in any particular geographical region. It is the energy consumption of appliance classes (e.g. all refrigerators or all water heaters), and their trends, that utilities are most interested in obtaining.

To collect this information, utilities typically select one to two hundred houses in a region, and monitor the electric consumption of the major appliances in each house. They then combine the information from the individual appliances together statistically to calculate the consumption of each class of appliance. Two methods are currently available for measuring the energy use of individual appliances in normal operation: The "Electric ARM" and New England Electric Systems's "MATREC" system. Both of these systems are described in *Proceedings: EPRI Load Research Symposium*, Electric Power Research Institute, Palo Alto, 1984. These systems are limited in the number of appliances they can monitor and, more importantly, they have the disadvantage of requiring electric utility personnel to enter the premises and connect sensors to individual appliances or the circuits feeding them. This is clearly undesirable as it disturbs the residents and may result in assumption by the utility of liability in respect to the home-owner owned wiring.

Accordingly, a need exists for a relatively low cost, versatile apparatus and method for monitoring and recording the energy consumption of individual appliances within a residence which may be installed external to the residence without requiring physical intrusion into the residence.

DISCLOSURE OF THE INVENTION

An apparatus and a method is provided for monitoring the energy consumption of individual appliances within a residence which does not require intrusion into the residence. Note that while the preliminary application currently foreseen for the present invention is residential, it is also suitable for industrial and commercial load-monitoring applications.

The apparatus consists in general of a measurement system comprised of electrical sensors suitably coupled to the power circuit entering the residence, an analog-to-digital converter for converting the sensed analog electrical parameters to digital form, and a digital computer for detecting changes in certain parameters and calculating the net change between steady state signal periods. The computer applies "cluster analysis" techniques to the change measurements to group them into those associated with the switching ON or OFF of a single appliance. A logic program within the computer analyzes the measured appliance energized (ON) and de-energized (OFF) parameter transitions to identify individual appliances and establish the energy consumption of such individual appliances. The computer also calculates total energy, time of use, appliance duty cycles and energy patterns. These measurements are fed to an output device for displaying the measured information. The output device may be a printer, tape drive, disk drive, telephone link to a data-storage facility, or any other suitable output device.

BRIEF DESCRIPTION OF THE DRAWINGS

FIG. 4A shows the real part of the load power consumption, while FIG. 4B shows the reactive power consumption versus time under the assumed conditions of appliance usage shown in FIG. 3, assuming that the line voltage is constant and presupposing that only the refrigerator contributes reactive power.

BEST MODE OF CARRYING OUT THE INVENTION

I. System Description

Figure 1:
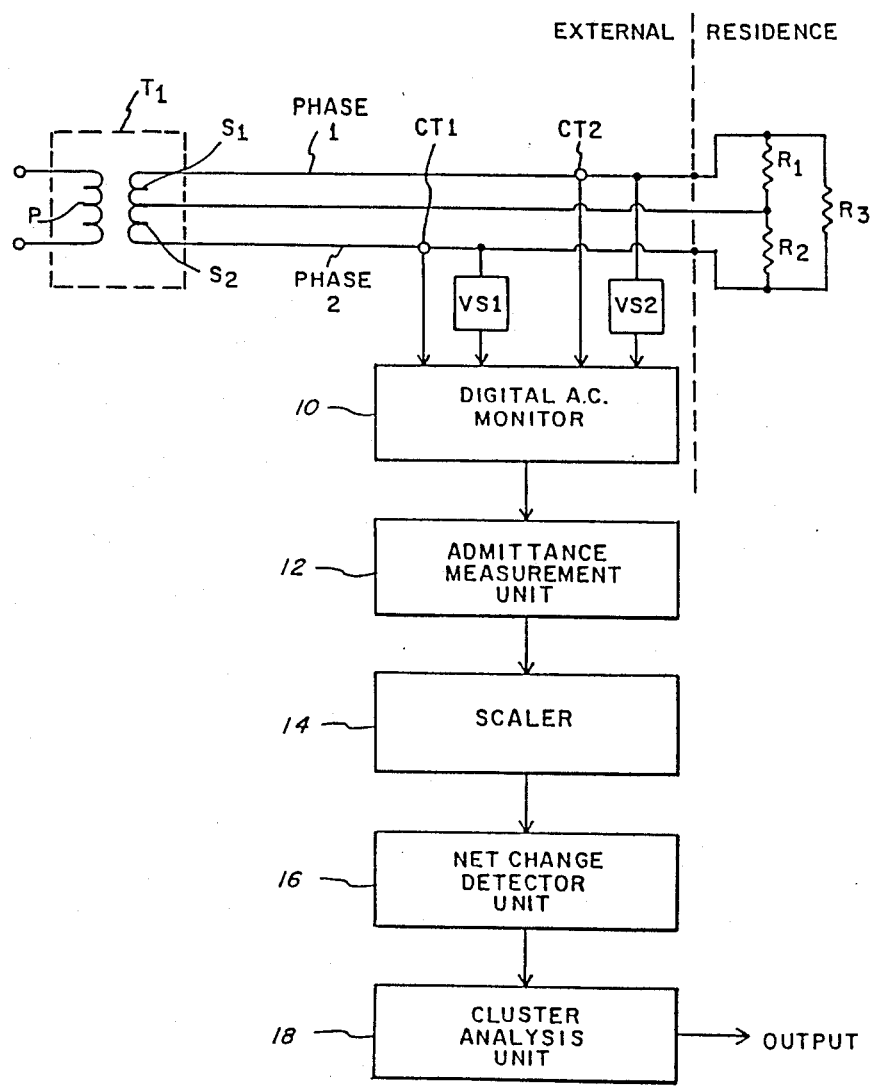
FIG. 1 is a schematic and block diagram of the overall system for non-intrusive appliance load monitoring.

A preferred embodiment of the invention will now be described in connection with the drawings. Referring now to FIG. 1, the pre-existing two phases (Phase I and Phase II) of the external distribution transformer T1 utilized to distribute power to individual residences are shown connected to internal residential loads R1, R2 and R3. Loads R1, R2 and R3 may each represent, for example, individual appliances such as toasters, refrigerators, water heaters, etc.

Voltage sensing transformers (potential transformers) or voltage dividers VS1 and VS2 are externally coupled to the two phase wires entering the residence to provide low voltage AC signals proportional to the voltage on each respective two phases of the circuit entering the residence. Current sensing transformers CT1 and CT2 are also externally coupled to the circuit to provide low-current AC signals proportional to the current on each of the two phases. These low voltage and low current signals are coupled to the input of a digital AC monitor 10. Monitor 10 samples the input AC signals at a rate preferably of at least one sample per second and converts the analog AC signals to digital form and determines the total real and reactive power consumed in the residence from measurements taken of the low voltage/current signals.

A general purpose digital AC monitor 10 suitable for this purpose is discussed in detail in a pending U.S. Pat. No. 4,672,555 entitled "Digital AC Monitor" filed Oct. 18, 1984 and is incorporated herein by reference.

Monitor 10 provides digital output signals proportional to the real power and the reactive power consumed in the residence on each phase. These output signals are coupled to an admittance measurement device 12 wherein the conductance (YG) and susceptance (YB) of the load is determined. Note that the admittance is equal to the vector sum of the conductance and susceptance. The conductance and susceptance measurements are normalized in scaler 14 to correct for the fact that line voltage can vary during measurement intervals. The normalized admittance signals YG and YB are coupled in parallel to net change detector 16 where the net change of the admittance signals between steady state periods is detected. The detected changes are then coupled to a cluster analysis unit 18 wherein each load or appliance causing the changes is identified and the total energy consumption of each such appliance is computed according to application of cluster analysis techniques. This information is summarized and displayed by the computer, for example, on a printer.

The details of units 12, 14, 16 and 18 will now be explained in connection with FIG. 2.

II. Admittance Measurement

Figure 2:
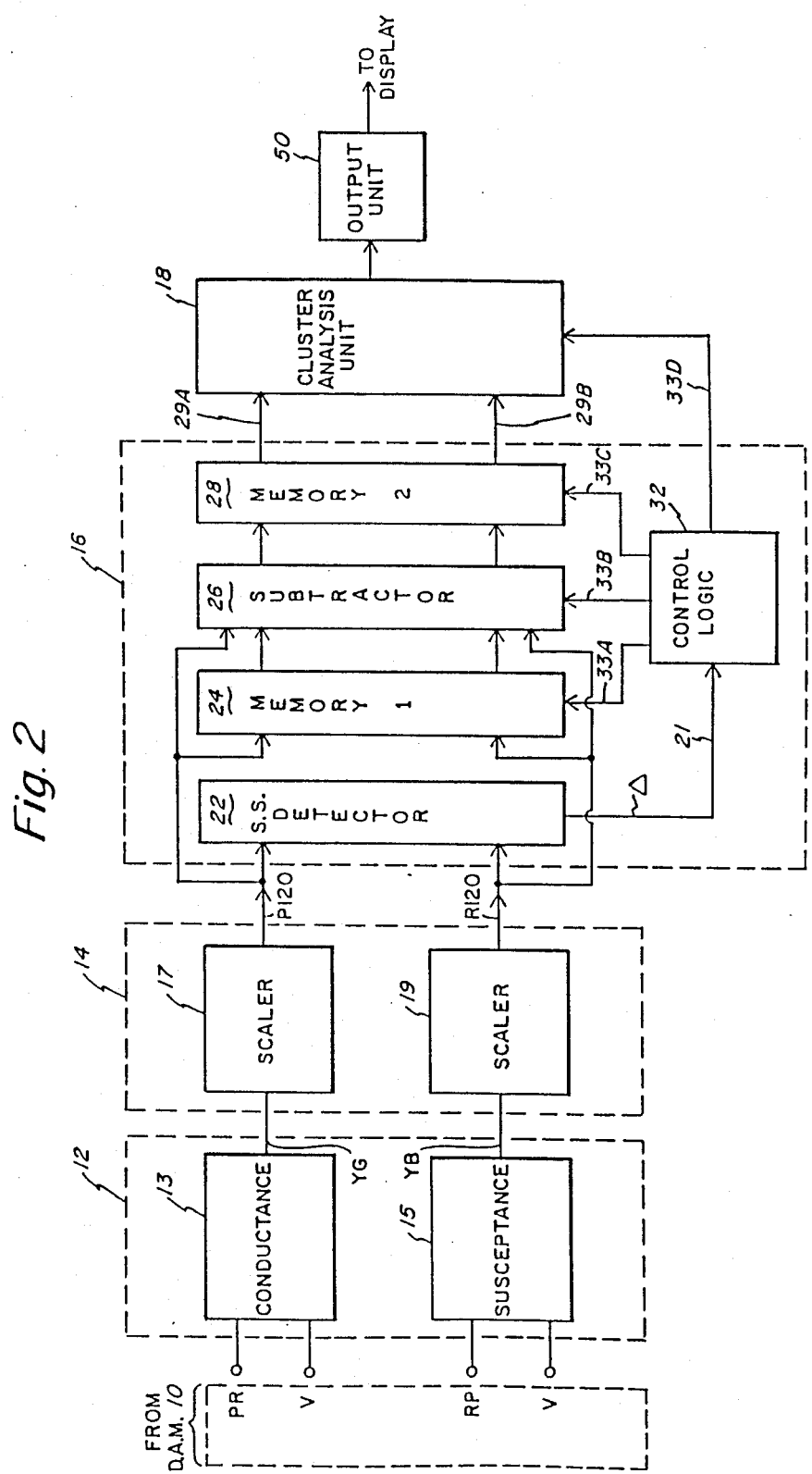
FIG. 2 is a block diagram of the admittance measurement unit, scaler, net change detector unit and cluster analysis unit for a single channel of a signal sensing circuit and method of the invention.

FIG. 2 is a block diagram of a single channel of a signal sensing circuit and method which may be employed to determine appliance characteristics in a non-intrusive manner. It should be noted that these circuits and methods may be implemented in either hardware or software. It should also be noted that a plurality of circuits can be measured conveniently by providing additional channels in parallel.

The first step in the process is to calculate the admittance of each circuit. Admittance is preferred as an appliance identifying parameter since it has a value which is more independent of line voltage variations, under most circumstances, than other possible choices of electrical parameters, such as, power, current, or reactive power. It also is additive, in that the admittance of two appliances operating in parallel is equal to the sum of their individual admittances. Admittance (Y) is the vector sum of the conductance (YG) and susceptance (YB). In accordance with the invention, conductance is calculated as the real power (PR) divided by the RMS voltage squared ($V^2$); while susceptance is calculated as the reactive power (RP) divided by the RMS voltage squared ($V^2$).

The real power (PR) and the reactive power (RP) consumed by each circuit under measurement is measured by DAM 10 (FIG. 1) and coupled in parallel to respective input terminals of conductance calculator 13 and susceptance calculator 15. Additionally, DAM 10 measures the RMS voltage (V) on each circuit and couples the value to a second input lead of each calculator. These output signals from DAM 10 are binary bit digital signals representing the calculated real and reactive power and RMS voltage.

Calculators 13 and 15 are well known digital divider circuits which divide PR and RP respectively by $V^2$ and produce parallel numeric results in digital signal form to scaler circuits 17 and 19, respectively.

III. Scaling

The function of scaler circuits 17 and 19 is to scale the admittance power signals by a constant factor which results in units of power. Preferably, this constant is equal to the nominal voltage squared (i.e. $120 \times 120 = 14400$). The net effect of scaling admittance measurements in this way is to normalize the original power measurements to values that are independent of utility voltage. In other words, the measurements are normalized to what they would have been if the utility voltage were a nominal 120 volts. The scalers may comprise simple well known digital multiplier circuits in which the values of YG and YB are multiplied by a stored constant of 14400 to determine the normalized admittance signals P120 and R120, respectively.

IV. Net Change Detection

The normalized admittance signals P120 and R120 are then coupled in parallel from scaler circuits 17 and 19 to change detecting apparatus 16 which determines when the signals are steady vs. changing, and calculates the net change between steady state periods. This circuitry consists of a steady state detector 22, a subtractor 26, two memory units 24 and 28, and control logic unit 32. The steady state detector 22 examines the admittance inputs from each power line circuit and determines if they are in a steady period. Detector 22 provides a signal on line 21 to the control logic 32 indicating a steady vs. changing set of measurements. This signal from detector 22 indicates steadiness only if all of the measurement signals are unchanging within a predetermined power tolerance threshold for some predetermined minimum time period. A preferable range of tolerance is ±35 watts or VARs, within a time period of 2 seconds normalized to 120 Volts.

The control logic 32 uses the signal from detector 22 to provide control signals over leads 33A-D to control the timing of the two memory units 24 and 28, subtractor 26 and to signal cluster analysis circuit 18 when the net change output signals on lines 29A and B are ready to be outputted.

The P120 and R120 values are also coupled to the input terminals of Memory 1 (unit 24) and subtractor 26. The present value of P120 and R120 is temporarily stored in Memory 1 and then coupled to subtractor 26 where it is used as the "previous steady state value" to be subtracted from the next "present" value. The resultant difference signal, represents the "net change" and may be either positive or negative. It is stored in Memory 2 (Unit 28), whereupon the cluster analysis unit 38 is informed by the control logic signal on line 33D that the net change is now available in Memory 2.

Control logic unit 32 may comprise a logic chip programmed to operate as follows:

(1) Wait during periods of change until the signal from the detector 22 indicates a steady period.

(2) Allow the subtraction unit 26 to subtract the previous steady state values stored in memory 24 from the present values.

(3) Store the resulting difference (which may be positive or negative) in memory 28.

(4) Store the present value of the measurements in memory 24 for subtracting during the next steady period.

(5) Inform the cluster analysis unit 38 that the net change is now available in memory 28.

(6) Wait until the delta signal signal on lead 21 indicates the measurements are changing again.

(7) Proceed to step (1) above.

The overall effect of the change detection unit 16 is to determine when the alternating periods of change and steady-state occur, and to calculate the net change between periods of steady state. By waiting for the measurements to settle down to steady state, starting transients (such as motor spikes) which would otherwise introduce error into the process are ignored. Net changes generally correspond to the turning ON or OFF of some appliance. As will be discussed, it is desirable that only these net changes be passed along to the cluster analysis unit.

V. Cluster Analysis

The purpose of cluster analysis is to determine which changes in the measurements are commonly observed. Frequently occurring changes can be safely assumed to be the result of an appliance turning ON or OFF. Occasional changes result from rarely used appliances or are assumed to be the result of noise or other errors in the measurements, or the effect of more than one appliance changing state simultaneously. Therefore, the number of clusters found indicates the number of appliances constituing the load and the number of changes in a cluster indicates the frequency of the appliance use. The characteristic changes in the measurements associated with each cluster are used to identify the nature of the individual appliances.

VI. ON/OFF Matching

The pairing of ON and OFF transitions enables the algorithm to determine the energy consumption of the individual appliances. A positive transition, i.e., an increase in normalized real power, is matched with a negative transition of approximately equal and opposite magnitude accurring at a later time. The real and reactive power associated with the transition multiplied by the on-time determines the energy consumption.

VII. Illustrative Example of Methodology

Figure 3:
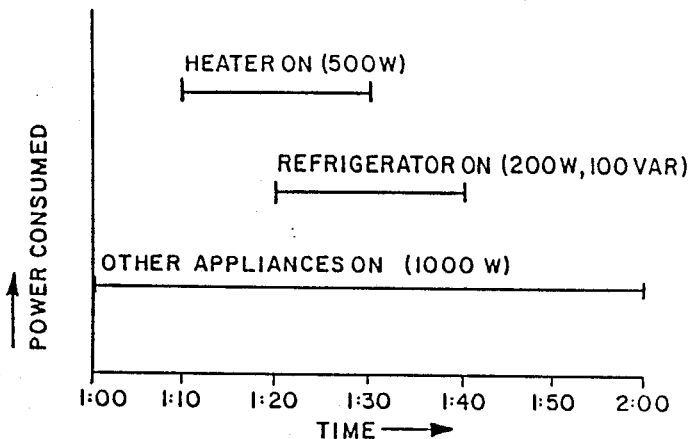
FIG. 3 is a plot of power consumed in a residence versus time for an illustrative example in which only two residential appliances are active during the time period.
Figure 4:
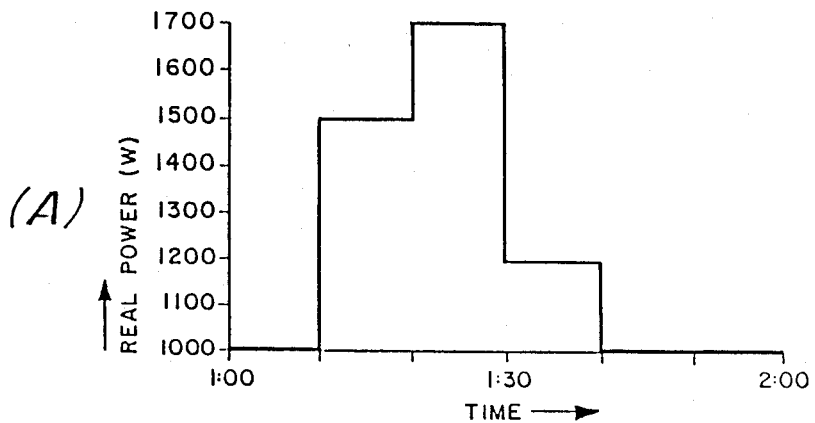
Figure 4:
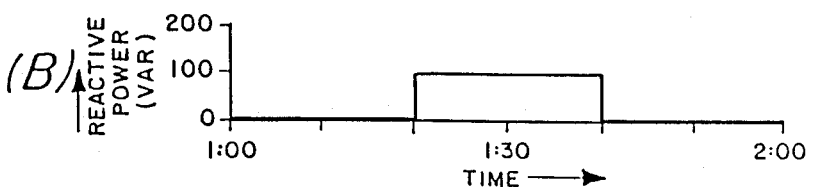
Figure 5:
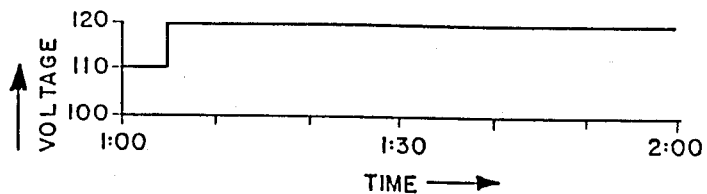
FIG. 5 is a plot of line voltage versus time under the assumption that the line voltage abruptly increases from 110 Volts to 120 Volts at time 1.05.

As an example of the invention, assume a residence in which only two appliances are active: a 500-Watt heater and a 200-Watt-100-VAR refrigerator. Suppose further, as shown in FIG. 3, that the heater is ON from 1:10 to 1:30, and that the refrigerator is ON from 1:30 to 1:40. If the "base load" of other appliances which are on constantly during this period is 1000 Watts, then the total load of the residence would appear as in FIGS. 4A and 4B if the line voltage were constant. FIG. 4A shows the real part of the load power consumption, while FIG. 4B shows the reactive power consumption, presupposing that only the refrigerator contributes reactive power. Assume further, that the line voltage abruptly increases from 110 V to 120 V at 1:05 as shown in FIG. 5. The actual power consumption before 1:05 would then be reduced to 840 Watts because of the lower voltage, as shown in FIG. 6.

Figure 6:
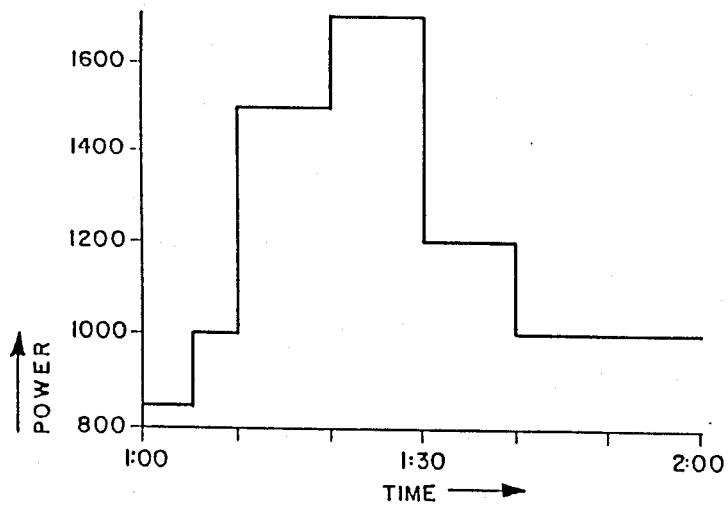
FIG. 6 is a plot of measured power versus time under the assumptions of FIG. 5.

The DAM 10 of FIG. 1 measures the power level shown in FIG. 6 along with the voltage level of FIG. 5, every second. From this the admittance is calculated and normalized every second by units 12 and 14 of FIG. 1. Before 1:05, the real part of the admittance is calculated as $840/110^2$ which is 0.0694 Mhos. This is then scaled up by a factor of $120^2$ resulting in a normalized power of 1000 Watts. After the voltage increase at 1:05, the power is measured as 1000 Watts, and the voltage as 120, so the admittance is calculated as $1000/120^2$, which is again 0.0694. This is again scaled to 1000 Watts. The net effect of these calculations is that even though the actual power abruptly increases 160 Watts (from 840 to 1000) at 1:05, the normalized power is constant during this period, so no false change is detected due to the 10 volt step in voltage.

Figure 7:
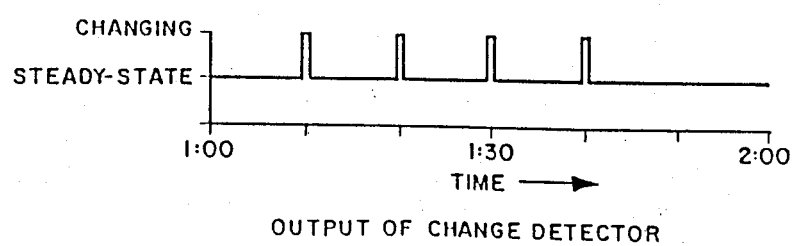
FIG. 7 is a plot of the output of the steady state detector 22 during the entire time period of FIG. 6.

From 1:05 on, the voltage is constant at 120 V, so the actual and normalized power are identical. At 1:10 heater is turned on and the power level changes from 1000 to 1500 Watts. During the few seconds that it is changing, the steady state detector 22 (FIG. 2) indicates the change to the control logic 32. After the power level settles down at 1500 W, the steady-state detector 22 again indicates the power is steady to the control logic 32. (FIG. 7 shows the output of the steady-state detector 22 for the entire period in question.)

When the control logic receives the steady indication, it causes the subtraction unit 26 to subtract the previous power level of 1000 Watts stored in Memory 24 from the current level of 1500 W. The difference (500 W) is held in Memory 28 for the cluster analysis unit CAU 18. Note that only the difference value between steady period to steady period is received by the cluster analysis unit regardless of how high or low the power may have varied during the period of transition. The current power level of 1500 W is held in Memory 24 for use in subtraction after the next change is detected.

A similar set of events happens as the next change (from 1500 W to 1700 W) takes place at 1:20. This results in a net change value of 200 W being passed to the cluster analysis unit 18. In addition, the reactive power increases from 0 to 100 VARs at this time, so a change of 100 VARs is also coupled to CAU 18 along with the 200 W value. The power level change from 1700 W to 1200 W at 1:30 results in a negative 500 W change value being passed to the CAU 18. At 1:40 a −200 W −100 VAR change is passed.

The observed change values are then grouped into "clusters" by CAU 18. A cluster of changes is simply a set of changes all of which are approximately the same.

The function of the cluster analysis unit 18 is to allow for a certain variation in the measured change each time an appliance is switched ON or OFF. Due to variations in the conditions when the appliance is turned on, and measurement noise in the sensors and A/D converter, the observed increase or decrease in power will not be exactly the same each time a particular appliance is energized or de-energized.

Figure 8:
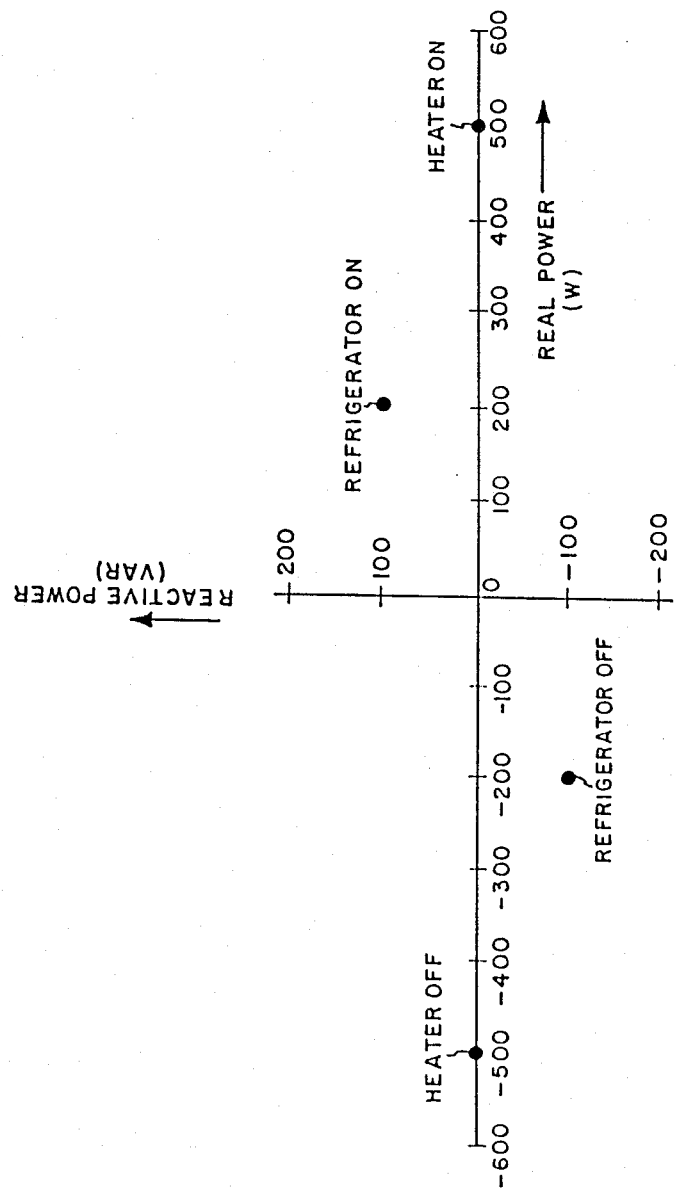
FIG. 8 is an illustration of the cluster of changes, as arranged by plotting the real power on the X-axis and the reactive power on the Y-axis.

The cluster analysis logic assigns the four above measured changes to the four clusters shown in FIG. 8. From this, the cluster analysis logic correctly determines the times at which the refrigerator and heater turned ON and OFF, and how much energy each used.

The net effect of the above procedure within the load monitor is to reconstruct the information in FIG. 3, so as to indicate what is happening to the appliances inside the residence, using only the waveforms of FIGS. 5 and 6, which are measured outside the house.

Actual data from a residence will be more complex than the above example indicates. There are likely to be several dozen clusters because there are typically dozens of appliances in a residence. There is more information available, however, than in the two-dimensional example given above. Several circuits such as the Phase 1 and Phase 2 circuits can be measured and the separate measurements compiled into a vector. The vector format allows clustering to be performed in a higher number of dimensions, preferably, at least four-dimensional clustering on a vector of changes in real and reactive power on each of the two phases into a home.

Many statistical techniques of cluster analysis are well-known and could be used for this purpose. For example, the following references each list dozens of cluster analysis techniques readily implemented by those skilled in the art:

Michael R. Anderberg, *Cluster Analysis for Applications*, Academic Press, 1973.

J. A. Hartigan, *Clustering Algorithms*, John Wiley and Sons, 1975.

From time to time, two appliances may be turned ON or OFF (or one ON and one OFF) simultaneously. When this occurs, the change which is computed in net change detector 16 will be the sum of the changes that would have been observed if the two appliances were switched at different times. For example, if a 200-watt and a 500-watt appliance are turned on simultaneously, a 700-watt increase in total power consumption of the house is observed. This 700-watt change is easily interpreted in the cluster analysis unit by a logic unit that recognizes and separates such changes on the basis that:

(a) It rarely happens. (e.g. The cluster of 700-watt changes is very small; perhaps containing only one example.)

(b) It occurs, in time, between two ON or two OFF transitions of some appliances. (e.g. The 700-watt change occurs between two −200 watt changes in a row—a +200 watt change is missing—and between two −500 watt changes—a +500 watt change is missing.)

(c) The observed change is approximately the sum of the two missing changes.

When all three of these conditions occur, the unusual observed transition is "broken apart" into its two simultaneous components, and the cluster analysis procedure continues as if the two components were available for matching ON's and OFF's.

Each ON/OFF pair of clusters (a positive and negative cluster of the same magnitude) represents a separate appliance or appliance component (for example the heater and motor of a dishwasher would be observed as two separate ON/OFF pairs). The CAU logic examines the properties of the clusters and tries to identify the appliance class of each (e.g. "refrigerator", "heater of dishwasher", etc.) To do this, the CAU includes a "lookup" table of appliance classes and their properties. The CAU logic circuit checks each cluster against the classes in the table to see which item in the table is closest to each observed cluster pair. The properties used will include expected values of the changes in the measured parameters. For example, refrigerators as a class are expected to exhibit a change of 100–500 watts on only a single phase when they turn on, while electric water heaters are expected to be approximately 4000 watts balanced on two phases. The table also can contain timing information, such as the average length of time per ON/OFF cycle of the appliance and the number of cycles per day. Expected time of day and time of year properties can also be used (e.g. lights are used more often at night, electric lawn movers are used more often in the day and in the summer.)

The method described will work with any given table, but it might not always result in a single unambiguous result. It is preferable that a training period be implemented during which the look-up table would be improved and lengthened as the method continues to be used and refined.

The final step is to produce a list of appliances observed, and parameters specifying the electric power usage such as their total energy consumption. This is accomplished in output unit 50. The energy can be broken up into day time/night time, or weekday/weekend if this is of interest to the end-users of the data. This can be done at intervals such as once per month. Each appliance will be identified by its class if the cluster analysis procedure was successful. If cluster analysis did not result in an unambiguous class for a given appliance, the properties of the appliance are provided so that the human expert can identify the class. The energy for each appliance is simply the sum of the energy consumed in each of the observed cycles, as calculated above.

Equivalents

Those skilled in the art will recognize that the above embodiment of the invention can be varied in many equivalent ways.

Alternative embodiments of the device could measure only the real part of the power or only the reactive part of the power. Other measurements from the following list could be used in addition to or in place of the power measurements for the same purpose:

Current

Power, current or admittance at the 3rd or 5th or some other L/C Harmonic

Power, current or admittance of sub-harmonics

DC bias current

Peak of turn-on starting transient

Duration of starting transient

Time constant of starting transient

Shape of starting transient

Normalizations other than $$P120 = \left[\frac{PR}{V^2}\right] \cdot 120^2$$

can be used. For example, the exponent can take on other values and need not be an integer.

The power consumed by the residence is preferably measured approximately every second. The exact rate is not critical to the method. A slower rate can be used, but this leads to more frequent errors by the device. A slightly higher rate may be preferable, but there is no apparent advantage in exceeding approximately ten measurements per second. The measurements need not be at regular intervals.

The system does not require use of a Digital AC monitor. Instead, power transducers can be used to provide an analog signal proportional to the power in each circuit, and analog-to-digital converters used to provide this information in a digital format. Many variations on this circuit will be apparent to one skilled in the art. For example multiplexors could be used to eliminate the parallel A/D converters and/or power transducers. The digital AC monitor was selected however because known state of the art transducers do not have a sufficiently rapid response time.

The digital computer used for cluster analysis in the current embodiment of the device is a Hewlett Packard Model 9845B, which contains the printer and tape drive output devices within it. The techniques by which the method described above could be converted for use on any particular digital computer with different output devices will be apparent to one skilled in the art.

It is anticipated that in a commercial implementation of the device, the apparatus would be conveniently mounted on the utility pole at which the sensors would be placed on the power circuit to the house to be monitored. Storage within the apparatus or a telephone connection via modem to a central computer would be provided to operate an output device. This arrangement would allow several houses to be monitored from a single device.

An alternative implementation would be to provide a "piggy-back" revenue meter socket. The apparatus could be placed in a container which plugs into the existing revenue meter socket on a home. The device would contain a socket into which the existing revenue meter could be plugged. The load data could then be extracted from the device at monthly intervals by the meter reader.

We claim:

1. Apparatus for non-intrusive measurement of energy usage and operating characteristics of each of a plurality of individual electric units, said units each contributing to a portion of a total electric load of a circuit of a facility, comprising:
   (a) sensor means for measuring electrical characteristics of the total load of said circuit and producing an analog signal proportional thereto, said sensor means being coupled to said circuit at a location external to said facility;
   (b) analog-to-digital conversion means for converting said analog signal into a digital signal; and
   (c) signal processor means responsive to said digital signal for separating out said portion of the total load contributed by each of the plurality of units.

2. The apparatus of claim 1 wherein the electrical characteristic is admittance, said admittance being comprised of a conductance and a susceptance, and the sensor means comprises voltage and current sensing transformers and the analog-to-digital means includes calculator means for calculating the values of the conductance YG and susceptance YB of the load from the sensed voltages and currents; wherein YG is calculated as $PR/V^2$ and YB is calculated as $RP/V^2$; in which RP=real power, PR=reactive power and V=RMS voltage.

3. The apparatus of claim 2 wherein the circuit is powered by voltage from a line and the calculator means includes scaler means for normalizing the calculated susceptance and conductance values with respect to a fixed value to avoid inconsistencies caused by voltage fluctuations on the line.

4. The apparatus of claim 1 wherein the units are taken from a class of electric units comprising appliances or machines.

5. The apparatus of claim 1 wherein the sensor means senses an electrical property taken from a class of voltage or current.

6. The apparatus of claim 1 including an output device for recording said portion of the total load due to each of the plurality of units.

7. The apparatus of claim 1 including an output device for displaying said portion of the total load due to each of the plurality of units.

8. Apparatus for non-intrusive measurement of load characteristics of each of a plurality of individual electric units in a facility, based on voltage and/or current sensing of the aggregate loads on a power circuit to which said units are connected, comprising:
   (a) monitor means coupled to said power circuit at a location external to said facility for sampling the aggregate load and converting the sampled load into digital signals representing at least one of the load characteristics from a group comprising: real power, reactive power, current, admittance, harmonics, sub-harmonics, dc current, starting-transient peak; starting-transient duration, starting-transient time-constant, or starting-transient shape;
   (b) net change detector means for determining from said signals changes in the load characteristics between periods of steady operation, by computing and generating a net change signal proportional to the net change in load characteristics from one steady period to a next steady period and;
   (c) cluster logic means responsive to said net change signal for:
      (i) determining which changes can be associated with a given unit having individual specific load characteristics;
      (ii) determining energy consumed by said unit between successive ON and OFF changes in load characteristics; and
      (iii) from the determinations in (i–ii) determining energy consumption and usage characteristics for each unit.

9. The apparatus of claim 8 further including, in said logic means, a means for normalizing the load characteristic for variations caused by changing circuit line-voltage, using the formula:

$$\text{Normalized Characteristic} = \text{Sensed Characteristic} \times \frac{\text{Reference Voltage}^N}{\text{Measured Voltage}}$$

wherein N is a constant.

10. The apparatus of claim 8 including, in said logic means, a means for analyzing simultaneous changes by detecting unusual changes which can consistently be decomposed into two or more individual appliance changes which add up to an observed change and which fit into a pattern of observed ON/OFF changes for individual units.

11. The apparatus of claim 10 wherein a unit class is identified based on changes and timing behavior of a cluster of changes.

12. The apparatus of claim 8 including means for displaying the energy consumption and usage characteristics for each unit.

13. The apparatus of claim 8 including means for recording the energy consumption and usage characteristics for each unit.

14. A method for non-intrusive measurement of energy usage and operating circuit load characteristics of each of a plurality of individual electric units coupled to an electrical power circuit in a facility, which power circuit receives electrical power from an external electrical power line comprising:
   (a) sampling the electrical power at the electrical power line and converting the sampled power into digital format to provide digital signals proportional to at least one of the circuit load characteristics from a group comprising: real power, reactive power, current, admittance, harmonics, sub-harmonics, dc current, starting-transient peak; starting-transient duration, starting-transient time-constant, or starting-transient shape;
   (b) determining changes in the circuit load characteristics between period of steady operation, by computing a net change in characteristics from one steady period to a next steady period;
   (c) determining which changes can be associated with the same unit;
   (d) determining the energy usage by a unit between successive ON and OFF changes in load characteristics;
   (e) from the determinations in steps (b) - (d) determining energy usage characteristics for each appliance.

15. The method of claim 14 wherein prior to step b, the load characteristics are normalized to correct for variations caused by changing circuit line-voltage, using the formula:

$$\text{Normalized Characteristic} = \text{Sensed Characteristic} \times \frac{\text{Reference Voltage}}{\text{Measured Voltage}}^N$$

wherein N is a constant.

16. The apparatus of claim 14 wherein if simultaneous changes occur in step c, they are analyzed be detecting any unusual changes which can consistently be decomposed into two or more individual unit changes which add up to one of the detected unusual change and which fit into a pattern of observed ON/OFF changes for individual units.

17. The method of claim 14 wherein a unit class is identified based on observed changes and timing behavior of a cluster of changes.

18. The method of claim 14 wherein the units are taken from a class of electric units comprising appliances or machines and the facility is taken from the class comprising residential commercial, or industrial facilities.

19. The method of claim 14 including the step of displaying the energy consumption and usage characteristics for each appliance.

20. The method of claim 14 including the step of recording the energy consumption and usage characteristics for each appliance.

* * * * *

UNITED STATES PATENT AND TRADEMARK OFFICE
CERTIFICATE OF CORRECTION

PATENT NO. : 4,858,141

DATED : August 15, 1989

INVENTOR(S) : George W. Hart, Edward C. Kern, Jr. and Fred C. Schweppe

It is certified that error appears in the above-identified patent and that said Letters Patent is hereby corrected as shown below:

Column 11, line 18, delete "period" and insert --periods--.

Column 12, line 14, delete "change" and insert --charges--.

Signed and Sealed this

Eighteenth Day of September, 1990

Attest:

HARRY F. MANBECK, JR.

*Attesting Officer*     *Commissioner of Patents and Trademarks*